(12) United States Patent
Wentzel et al.

(10) Patent No.: US 6,430,047 B2
(45) Date of Patent: *Aug. 6, 2002

(54) STANDARDIZED TEST BOARD FOR TESTING CUSTOM CHIPS

(75) Inventors: Earl E. Wentzel, Minneapolis; Brant R. Gourley, Eagan; Gregory A. King, Lakeville; Paul F. Cisewski, Brooklyn Park; Steven V. Stang, Inver Grove Heights; Gregory P. Micko, Cottage Grove; Brian J. Sandvold, Blaine, all of MN (US)

(73) Assignee: Agere Systems Guardian Corp., Orlando, FL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/412,089

(22) Filed: Oct. 4, 1999

Related U.S. Application Data

(60) Provisional application No. 60/136,515, filed on May 28, 1999.

(51) Int. Cl.[7] ................................................. H05K 7/20
(52) U.S. Cl. ........................ 361/704; 361/700; 361/702; 257/706; 165/80.3
(58) Field of Search .......................... 361/690, 700–721, 361/724, 764, 767, 820, 754; 257/698, 700, 706–727, 737, 686, 786, 787, 648; 324/754, 755, 758; 174/16.3, 252, 261, 254; 165/80.2, 80.3, 80.4, 185

(56) References Cited

U.S. PATENT DOCUMENTS

| | | | | |
|---|---|---|---|---|
| 4,195,195 A | * | 3/1980 | De Miranda et al. ...... 174/68.5 |
| 5,061,988 A | * | 10/1991 | Rector .......................... 357/74 |
| 5,375,039 A | * | 12/1994 | Wiessa ........................ 361/720 |
| 5,378,981 A | * | 1/1995 | Higgins ....................... 324/765 |
| 5,410,184 A | * | 4/1995 | Melton et al. ............... 257/772 |
| 5,590,462 A | * | 1/1997 | Hundt et al. .................. 29/840 |
| 5,640,047 A | * | 6/1997 | Nakashima .................. 257/738 |
| 5,708,566 A | * | 1/1998 | Hunninghaus et al. ...... 361/764 |
| 5,739,586 A | * | 4/1998 | Cannizzaro et al. ......... 257/712 |
| 5,741,729 A | * | 4/1998 | Selna .......................... 438/125 |
| 5,751,554 A | * | 5/1998 | Williams et al. ............. 361/760 |

(List continued on next page.)

FOREIGN PATENT DOCUMENTS

| | | | | |
|---|---|---|---|---|
| JP | 402058358 A | * | 2/1990 | ........... H01L/23/36 |
| JP | 404279097 A | * | 10/1992 | ........... H05K/7/20 |

*Primary Examiner*—Lynn D. Feild
*Assistant Examiner*—Michael Datskovsky
(74) *Attorney, Agent, or Firm*—Kinney & Lange, P.A.

(57) ABSTRACT

A printed wiring board provides connection between a chip and a standard footprint layout of a test machine. An insulating substrate defines a chip receiving region having a plurality of chip connector pads on one side of the substrate for connection to bump contacts of custom integrated circuit chips. A plurality of layout connectors are in a layout connection region of the board and arranged in the standard footprint layout. Circuit traces provide electrical connection between the chip connectors and the layout connectors, and a solder stop on the substrate extends over the circuit traces between the chip receiving region and the layout connection region. A plurality of plated apertures extend through the substrate in the chip receiving region to a thermally conductive heat sink opposite the chip connectors. In use, a chip is mounted to the board in the chip receiving region and connected to the chip connectors to rigidly mount the chip to the board. A thermally conductive paste extends through the apertures to thermally connect the chip to the heat sink. The solder stop prevents solder connecting the chip to the chip connectors from wicking along the traces thereby preventing deformation of the bump contacts.

19 Claims, 6 Drawing Sheets

U.S. PATENT DOCUMENTS 5,757,201 A * 5/1998 Partridge et al. ............ 324/754
5,942,795 A * 8/1999 Hoang ........................ 257/692
5,945,837 A * 8/1999 Frederickson ............... 324/761
5,959,356 A * 9/1999 Oh ............................. 257/738
6,034,426 A * 3/2000 Patel et al. .................. 257/698
6,043,986 A * 3/2000 Kondo et al. ................ 361/720
6,081,429 A * 6/2000 Barret ........................ 361/767
6,156,980 A * 12/2000 Peugh et al. ................. 174/252

* cited by examiner

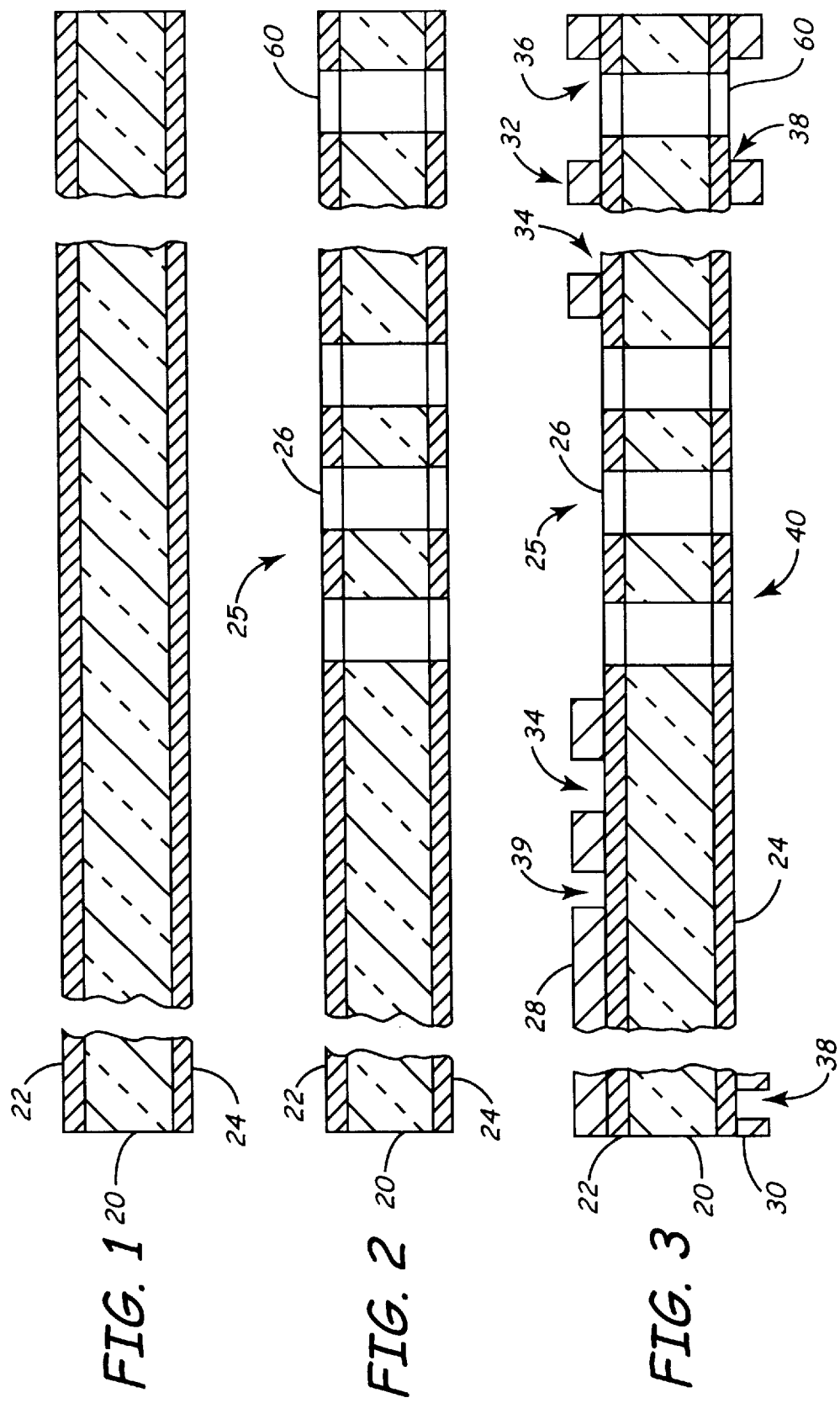

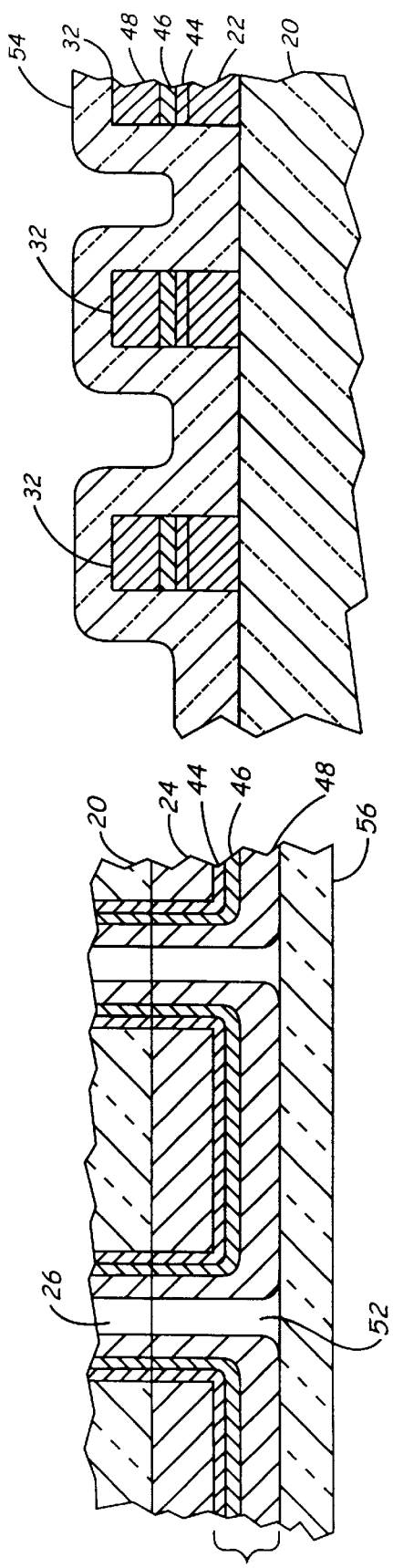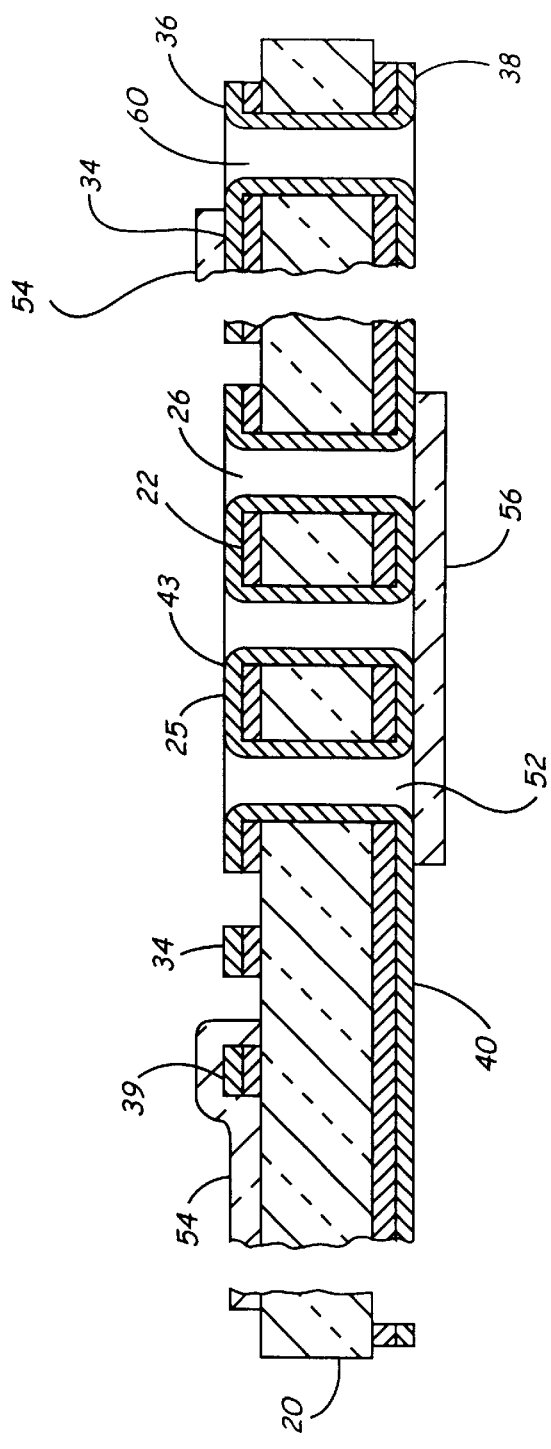

STANDARDIZED TEST BOARD FOR TESTING CUSTOM CHIPS

CROSS-REFERENCE TO RELATED APPLICATION(S)

This application claims priority of provisional application No. 60/136,515 filed May 28, 1999 for "TEST BOARD FOR TESTING BUMP CONTACT CHIPS" by Earl Wentzel, Brant Gourley, Greg King, Paul Cisewski, Steve Stang, Greg Micko and Brian Sandvold.

BACKGROUND OF THE INVENTION

This application relates to circuit boards to which integrated circuit (IC) chips may be mounted, and particularly to circuit boards for receiving custom chips, wherein the boards have standardized form factors that allow the chips to be tested in a standard testing apparatus.

IC chips are employed in a wide variety of electronic products including household appliances, vehicles, computers and computer peripheral equipment. As electronic products become smaller, less expensive and more complex, the need for IC chips in such products increases. Customarily, IC chip manufacturers design IC chips to perform specific functions, and market custom versions of those chips to individual original equipment manufacturers (OEM) of the electronic equipment. For example, the manufacturer of an IC chip designed for read/write circuits in a magnetic disk drive might market different versions of the same circuit, and hence of the same chip design, to different disk drive manufacturers. Each disk drive manufacturer receives a version of the chip design that is customized for the needs of that manufacturer. Often, the differences in various chip versions includes differences in pad layout and chip size.

It is important to the manufacturing and marketing processes that all versions of the chip be tested to make certain that the chips perform as required by the OEM customer. Thus, where an OEM customer desires a custom modification of an existing chip, even that custom modification must be tested. However, changing chip layout designs, as is often the case in custom modification of IC chips, results in the proliferation of different versions of the chip size and pad layout ("footprint"), leading to difficulties in the testing of the several chip versions in a standard test device. The present invention is directed to a test board that provides a standard pad and size layout (footprint) to a test machine, yet accommodates IC chips of varying footprints and custom design. As a result, custom chips and chips with altered layout (footprints) can be tested employing the test board according to the present invention.

While the present invention will be described in connection with IC chips having solder bump contacts and conductive pads on the test board arranged in a pattern to receive the bump contacts, it is understood the invention is applicable to other forms of contact connection including area grid arrays, compliant lead contacts on chips receivable on conductive pads as well as insertable contacts such as bayonet and knife contacts receivable in conductive apertures.

BRIEF SUMMARY OF THE INVENTION

A printed wiring board according to the present invention receives a custom integrated circuit chip and provides connection between the chip and a standard footprint layout, such as for a test apparatus. The board includes an insulating substrate that defines a chip receiving region and a separated layout connection region. A plurality of chip connectors, such as bump contact pads, are on one side of the substrate within the chip receiving region. The chip connectors are arranged in a pattern for connection to various custom integrated circuit chips. A plurality of layout connectors are in the layout connection region of the board. At least some of the layout connectors are on the same side of the board as the chip connectors and all of the layout connectors are arranged in a standard footprint layout, such as one accommodating a test apparatus. A plurality of circuit traces on the same side of the substrate as the chip connectors provide electrical connection between individual ones of the chip connectors in the chip receiving region and individual ones of the layout connectors in the layout connection region. A solder stop on the substrate extends over the circuit traces between the chip receiving region and the layout connection region. A plurality of apertures extend through the substrate in the chip receiving region, and a thermally conductive heat sink on the side of the substrate opposite the chip connectors is thermally connected to the plurality of apertures. In use, a chip mounted to the board in the chip receiving region and connected to the chip connectors is mounted by the solder bump contacts which melt and fuse to the chip connectors (contact pads) on the board. The solder stop confines the melted solder to the region of the chip connectors to prevent the bump contacts from deforming and wicking along the traces, thereby preventing collapsing of the bump contacts. A thermally conductive paste extends through the apertures to thermally connect the chip to the heat sink.

In some embodiments, plated holes through the heat sink connect the heat sink to the apertures, and a seal is positioned over the heat sink closing the plated holes. In some embodiments the layout connectors are on both sides of the substrate with plated holes connecting the layout connectors on opposite sides of the substrate.

BRIEF DESCRIPTION OF THE DRAWINGS

FIGS. 1–9 are section views illustrating manufacture of a test board accordance to the presently preferred embodiment of the present invention, FIG. 7 being taken along line 7—7 in FIG. 11 and FIG. 9 being taken along line 9—9 in FIG. 10.

DETAILED DESCRIPTION

Figure 4:
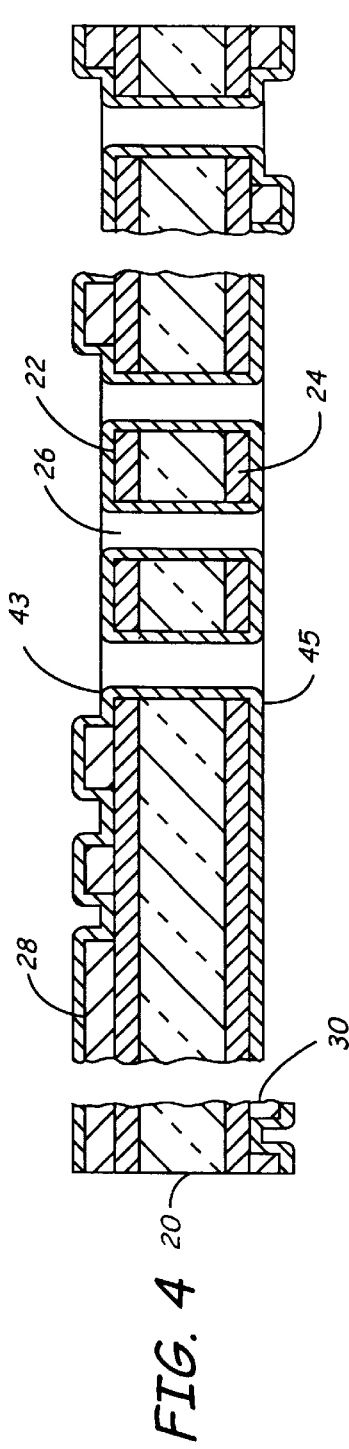

FIGS. 1–9 are section views illustrating in the steps of manufacturing a test board in accordance with the presently preferred embodiment of the present invention. A polyimide board 20 is cladded with copper layers 22 and 24 to form a laminate board consisting of the insulating polyimide structure and laminated copper layers 22 and 24 (FIG. 1). Apertures 26 (FIG. 2) are drilled through the laminate in the region 25 (FIG. 10) that will eventually accommodate the chip under test. There may be any number of such apertures 26, but as will be more fully described in connection with FIGS. 10 and 11, apertures 26 are confined to the chip receiving region 25 to provide thermal connection to a heat sink for the chip. Additionally, apertures 60 are preferably drilled through the laminate between the portions of layers 22 and 24 that will become pads 36 and 38.

Figure 10:
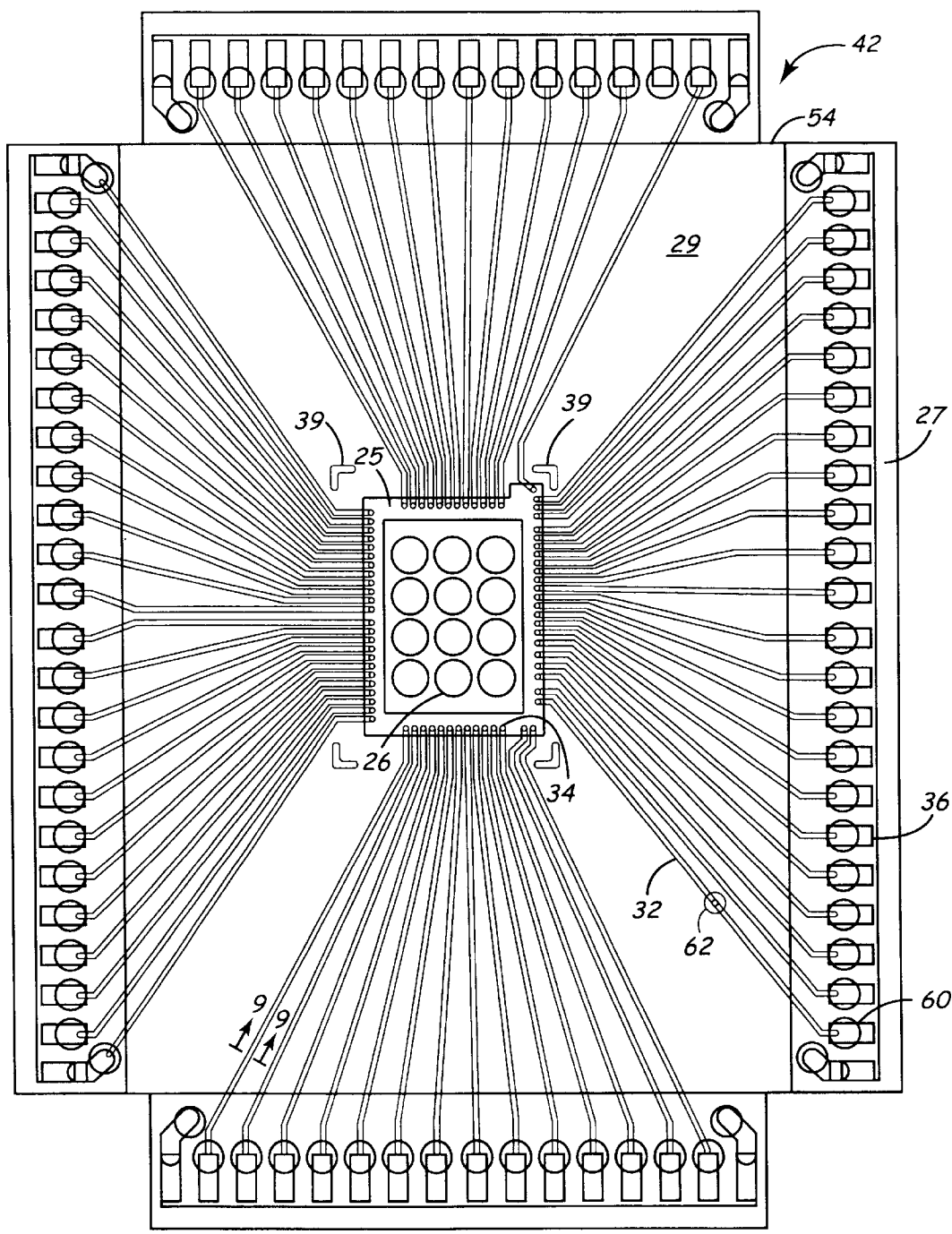
FIGS. 10 and 11 are a plan views of opposite sides of the completed test board.
Figure 11:
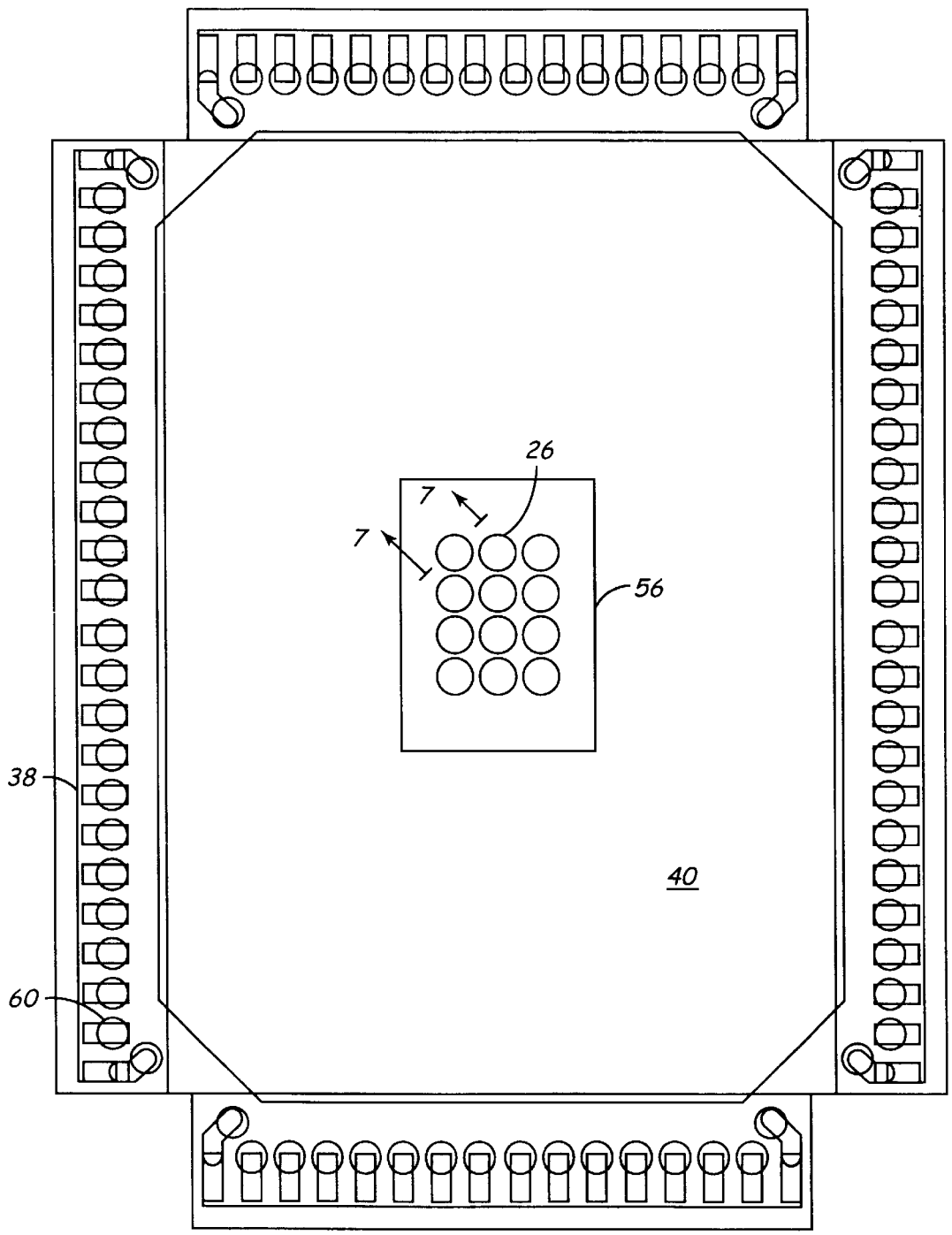

As shown in FIG. 3, a mask 28, such as a photoresist, is applied to the exposed surfaces of copper layer 22 and patterned to expose portions of copper layer 22 to define chip receiving region 25, pads 34 for connection to the chip, pads 36 for connection to the test machine, circuit traces 32 that extend between pads 34 and 36, and registration or alignment indicia 39 (FIG. 10). Similarly, mask 30, also preferably formed of a suitable photoresist, is applied to the exposed surface of copper layer 24 and patterned to expose portions of copper layer 24 to define pads 38 for connection to the test machine and heat sink 40 (FIG. 11). As shown particularly in FIGS. 10 and 11, traces 32, pads 34 and 36 and indicia 39 are on one side of test board 42 and pads 38 and heat sink 40 are on the opposite side of test board 42. Pads 36 and 38 are in a layout connection region 27 at the outer bounds of substrate 20 and are configured to accommodate a standard footprint of a test machine or the like. A trace region 29 is between chip region 25 and layout connection region 27 and accommodates traces 32 and indicia 39. Thus, masks 28 and 30 are patterned to expose copper layers 22 and 24 in the regions of the traces, pads, indicia and heat sink.

Figure 5:
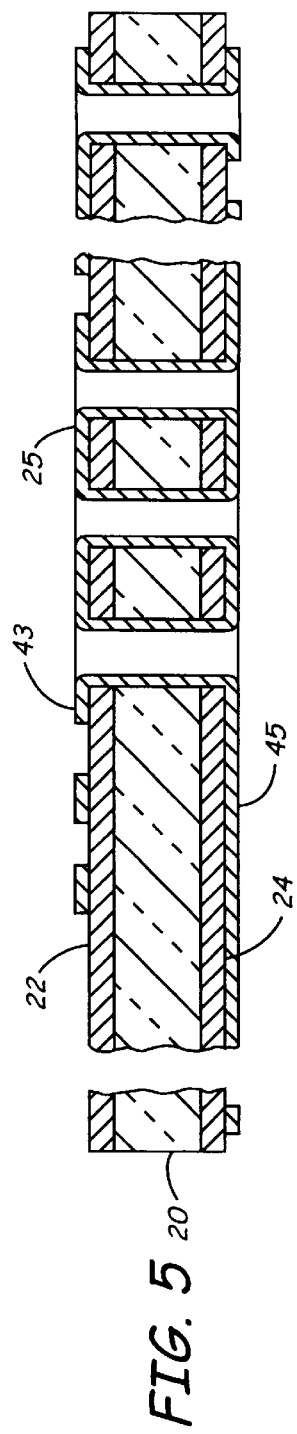
Figure 6:
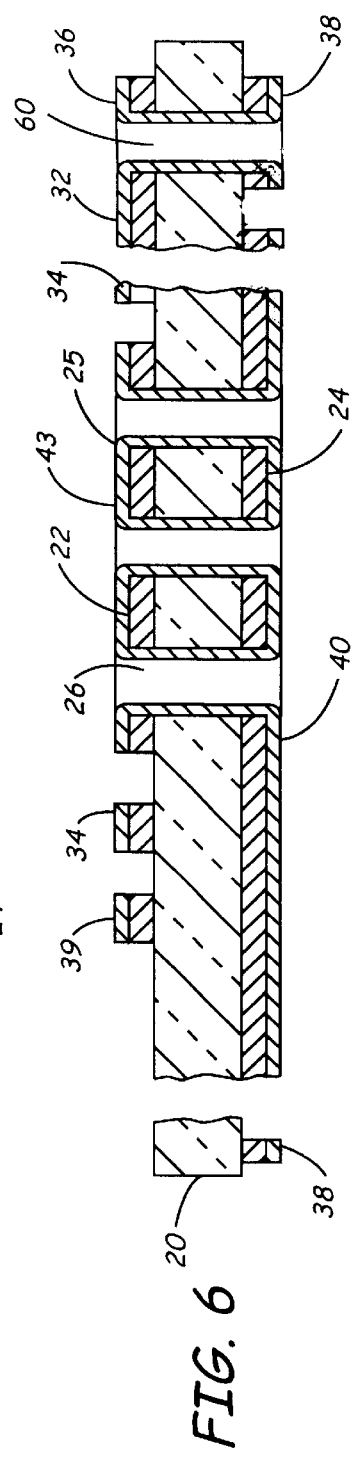

As shown in FIG. 4, a conductive layer 43 is deposited onto the exposed surfaces of copper layer 22 and mask 28, and conductive layer 45 is deposited onto the exposed surfaces of copper layer 24, mask 30 and the exposed surfaces of apertures 26 and 60 in polyimide board 20. As will be explained in greater detail in connection with FIG. 7, conductive layers 43 and 45 each comprise a copper underlayer deposited onto copper layers 22 and 24 and the surfaces of polyimide board 20 exposed by apertures 26 and 60, a nickel seedlayer deposited onto the copper underlayer, and a gold conductive layer deposited onto the nickel seedlayer. As shown in FIG. 5, masks 28 and 30 are then stripped away, leaving the gold-plated trace, pad, indicia, chip receiving and heat sink patterns on copper layers 22 and 24. As shown in FIG. 6, exposed portions of copper layers 24 and 22 are then etched away using an etchant that does not appreciably attack the polyimide, nickel or gold. The result, shown in FIG. 6, is the polyimide substrate with gold-plated pads 34 and 36, chip receiving region 25, traces 32 and registration or alignment indicia 39 formed by copper layer 22, and conductive layer 43 of copper, nickel and gold, and gold-plated heat sink 40 and pads 38 formed by copper layer 24, and the copper-nickel-gold conductive layer 45.

As illustrated particularly in FIG. 7, the copper-nickel-gold layers 43 and 45 are formed by depositing copper layer 44 onto the surface of a respective cooper layer 22 or 24. Copper layer adheres well to the polyimide material of board 20 exposed by drilling apertures 26 and 60. Next, nickel seedlayer 46 is plated onto the exposed portions of copper layer 44, and gold layer 48 is plated onto nickel seedlayer 46. Apertures 26 in polyimide board 20 extend through openings 52 on the side adjacent lower layer 24. As shown in FIGS. 7, 8 and 11, these openings 52 will be closed by seal 56.

As shown in FIGS. 8, 9 and 10, a solder mask 54 is applied over trace region 29 of wiring board 42 to cover traces 32 and alignment indicia 39. Solder mask 54 is a dry film that is applied to the board surface in a manner well known in the art. The solder mask film is applied over traces 32 and alignment indicia 39 in the trace region 29 between chip region 25 and layout connection region 27, leaving pads 34 and pads 36 exposed. Preferably, the inner bounds of solder mask 54 is about 6.5 mils from the centers of pads 34 to prevent solder from flowing from pads 34 along traces 32 when attaching a chip to the board. More particularly, when attaching solder bump contacts of the chip to pads 34, the molten solder may wick and flow along the traces to deform and collapse the bump contact on the chip. The solder mask prevents this wicking and flowing, thereby maintaining the integrity of the bump contact and assuring good electrical and mechanical connection of the chip to the board. Similarly as shown in FIGS. 7, 8 and 11, a second solder mask 56, also in the form of a dry film, is applied to the opposite side of the board in the chip region to close and seal apertures 52.

As shown particularly in FIGS. 6 and 8, apertures 60 are plated with conductive copper-nickel-gold layers 43, 45 to connect pads 36 (FIG. 10) on one side of the board with pads 38 (FIG. 11) on the other side of the board. Pads 36 and 38 are configured in standard footprints to be received by a suitable test apparatus and the like.

Figure 12:
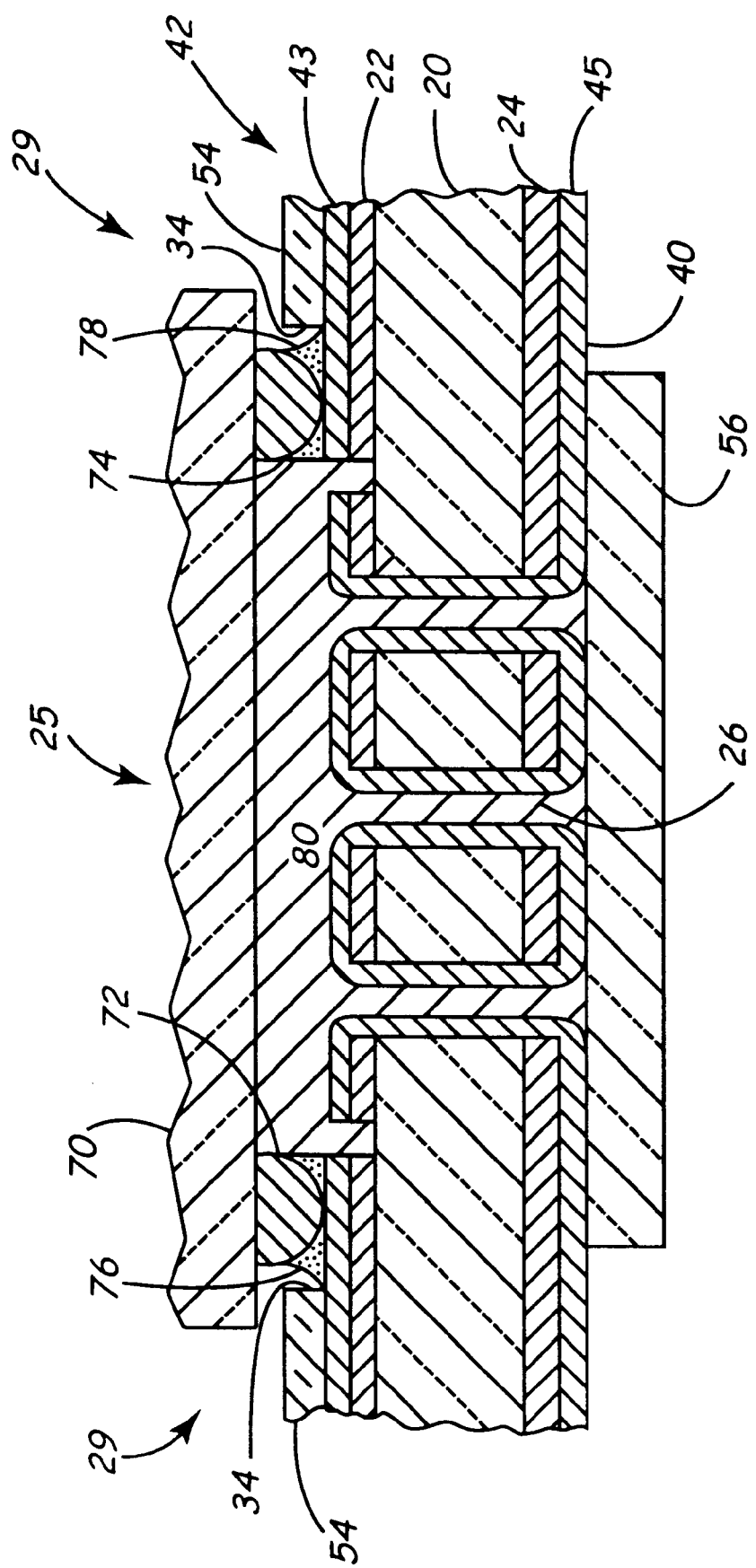
FIG. 12 is a section view, as in FIG. 8, showing the mounting and connection of an IC chip to the test board.

FIG. 12 is a section view, as in FIG. 8, illustrating chip 70 fastened to board 42. Chip 70 occupies the region 25 of the board and includes bump contacts 72 and 74 that are connected to pads 34 by solder 76 and 78 reflowed from the contacts to the pads. The edge of solder mask 54 is approximately 6.5 mils from the center of pads 34 so that solder mask 54 effectively prevents solder from flowing past the boundary of the solder mask. As a result, solder is prevented from flowing along the circuit traces 32, thereby eliminating possible collapsing of the bump contact on the chip. During the process of attaching the chip to the board, the chip is held in alignment to the board by the solder flux used to wet the surface of pads 34. The chip self-aligns to the board by surface tension between the chip bump contacts and pads 34 on the board during reflow of the solder. Thereafter, an electrically insulating, thermally conductive bonding material 80 is injected into the cavity between chip 70 and the conductive material between apertures 26 on the board. Excess bonding material flows into apertures 26 to establish thermal connection with heat sink 40, thereby providing good thermal connection between chip 70 and heat sink 40.

In use, a chip to be tested is aligned to the board using alignment markings 39 and is mounted and bonded to the board as described above, thereby establishing electrical connection to the bump contacts on the chip by pads 34 and traces 32 to pads 36 and 38 and establishing thermal connection to heat sink 40. During solder reflow, the chip aligns to the board by surface tension between the chip bump contact and the pads 34 on the board. Solder flux that aids in solder flow and prevents oxidation during reflow holds the chip in alignment during the solder reflow process. While each bump contact on the chip engages a pad 34 on the board, not all pads 34 necessarily engage a bump contact on the chip, depending on the configuration of the chip. Thus, each bump contact on a chip engages a respective pad 34, but there may be additional pads that remain unconnected for given chips, and hence are unused. As a result, the pad pattern on the board may accommodate several chip bump configurations and may be designed for more universal use. Additionally, heat sink 40 may serve as a ground plane opposite traces 32, in which case plated holes through 62 (FIG. 10) may be added to the board to connect selected traces 32 to heat sink/ground plane 40.

Although the present invention has been described with reference to preferred embodiments, workers skilled in the art will recognize that changes may be made in form and detail without departing from the spirit and scope of the invention.

What is claimed is:

1. A circuit board for receiving a integrated circuit chip to provide connection between a standard layout of a test machine and the chip, the board comprising:
   an insulating substrate defining a chip receiving region and a layout connection region, the layout connection region surrounding and spaced from the chip receiving region;

a plurality of chip connectors on one side of the substrate within the chip receiving region, the plurality of chip connectors being arranged in a selected pattern suited for connection to integrated circuit chips;

a plurality of layout connectors with some thereof on the one side of the substrate within the layout connection region and some on the opposite side of the substrate that are interconnected to those on the one side, the plurality of layout connectors being arranged in the standard footprint layout of the test machine;

a plurality of circuit traces on the one side of the substrate between the chip receiving region and the layout connection region, each circuit trace providing electrical connection between one of the chip connectors and a respective one of the layout connectors;

a solder stop on the one side of the substrate over the circuit traces between the chip receiving region and the layout connection region;

a plurality of apertures through the substrate in the chip receiving region; and a thermally conductive heat sink on a side of the substrate opposite the one side and across from but extending beyond the chip receiving region to be adjacent to those layout connectors on the same side of the substrate, the heat sink being thermally connected about the plurality of apertures.

2. A printed circuit board according to claim 1, wherein the board is arranged to receive an integrated circuit chip on the one side of the substrate within the chip receiving region so that at least some of the chip connectors are connected to individual contacts of the chip and that contacts on the chip are connected to at least some of the chip connectors to thereby leave remaining portions of the integrated circuit chip spaced apart from the substrate, and a thermally conductive, electrically insulative paste between the chip and the substrate and extending through the plurality of apertures to thermally connect the chip to the heat sink.

3. A circuit board according to claim 2, including a conductive layer on a surface in the apertures, the conductive layer extending through the heat sink about holes in the heat sink, and a seal over the heat sink closing the heat sink holes.

4. A circuit board according to claim 3, including layout connectors on both the one side of the substrate and the opposite side of the substrate, layout connectors on the opposite side of the substrate being electrically connected to layout connectors on the one side of the substrate through plated holes in the substrate.

5. A circuit board according to claim 2, including layout connectors on both the one side of the substrate and the opposite side of the substrate, layout connectors on the opposite side of the substrate being electrically connected to layout connectors on the one side of the substrate through plated holes in the substrate.

6. A circuit board according to claim 2, including plated holes though the substrate connecting selected traces on the one side of the substrate to the heat sink on the opposite side of the substrate.

7. A circuit board according to claim 6, including layout connectors on both the one side of the substrate and the opposite side of the substrate, layout connectors on the opposite side of the substrate being electrically connected to layout connectors on the one side of the substrate through plated holes in the substrate.

8. A circuit board according to claim 1, including plated holes through the heat sink connecting the plating to the heat sink, and a seal over the heat sink closing the plated holes.

9. A circuit board according to claim 1, including plated holes though the substrate connecting selected traces on the one side of the substrate to the heat sink on the opposite side of the substrate.

10. A circuit board according to claim 1, including layout connectors on both the one side of the substrate and the opposite side of the substrate, layout connectors on the opposite side of the substrate being electrically connected to layout connectors on the one side of the substrate through plated holes in the substrate.

11. A circuit board according to claim 1, wherein the chip connectors are pads arranged to receive bump contacts of a chip.

12. An assembly of an integrated circuit chip comprising:

an integrated circuit chip having a plurality of chip contacts arranged in a selected pattern protruding from a side thereof;

a circuit board having:

an insulating substrate defining a chip receiving region and a layout connection region, the layout connection region surrounding and spaced from the chip receiving region, a plurality of chip connectors on one side of the substrate within the chip receiving region with the integrated circuit chip side facing, but spaced apart from, the chip receiving region, the plurality of chip connectors being arranged in a pattern, at least some of the chip connectors being connected to respective ones of the chip contacts and at least some of the chip contacts being connected to respective chip connectors, a plurality of layout connectors on at least the one side of the substrate within the layout connection region, the plurality of layout connectors being arranged in a standard footprint layout of a test machine, a plurality of circuit traces on the one side of the substrate between the chip receiving region and the layout connection region, each circuit trace providing electrical connection between one of the chip connectors and a respective one of the layout connectors, a solder stop on the one side of the substrate over the circuit traces between the chip receiving region and the layout connection region, a plurality of apertures through the substrate in the chip receiving region, and a thermally conductive heat sink on a side of the substrate opposite the one side and within the chip receiving region, the heat sink being thermally connected about the plurality of apertures; and a thermally conductive, electrically insulative paste between the chip and the substrate and extending through the plurality of apertures to thermally connect the chip to the heat sink.

13. The assembly according to claim 12, including layout connectors on both the one side of the substrate and the opposite side of the substrate, layout connectors on the opposite side of the substrate being electrically connected to layout connectors on the one side of the substrate.

14. The assembly according to claim 12, wherein the chip contacts are bump contacts and the chip connectors are pads arranged to receive the bump contacts.

15. The assembly according to claim 12, including a conductive layer on a surface in the apertures, the conductive layer extending through the heat sink about holes in the heat sink, and a seal over the heat sink closing the heat sink holes.

16. The assembly according to claim 15, including layout connectors on both the one side of the substrate and the opposite side of the substrate, layout connectors on the opposite side of the substrate being electrically connected to layout connectors on the one side of the substrate.

17. The assembly according to claim 15, wherein the chip contacts are bump contacts and the chip connectors are pads arranged to receive the bump contacts.

18. In a process for testing integrated circuit chips using a test machine that has a standard footprint layout for accommodating connection to integrated circuit chips, the integrated circuit chip having a plurality of bump contacts arranged in a pattern, the improvement comprising:

provic a circuit board having an insulating substrate defining a chip receiving region and a layout connection region, the layout connection region surrounding and spaced from the chip receiving region, a plurality of chip connectors on one side of the substrate within the chip receiving region, the plurality of chip connectors being arranged in a selected pattern, a plurality of layout connectors on at least the one side of the substrate within the layout connection region, the plurality of layout connectors being arranged in the standard footprint layout of the test machine, a plurality of circuit traces on the one side of the substrate between the chip receiving region and the layout connection region, each circuit trace providing electrical connection between one of the chip connectors and a respective one of the layout connectors, a solder stop on the one side of the substrate over the circuit traces between the chip receiving region and the layout connection region, a plurality of apertures through the substrate in the chip receiving region, and a thermally conductive heat sink on a side of the substrate opposite the one side and within the chip receiving region;

aligning an integrated circuit chip to the circuit board so that each of the plurality of bump contacts on and protruding from the chip are aligned to a respective one of the chip connectors;

reflowing solder from the bump contacts to electrically and mechanically connect the bump contacts to the respective ones of the chip connectors, the reflow process including preventing wicking of solder along the traces by the solder stop to substantially prevent deformation of the bump contacts; and injecting a thermally conductive, electrically insulative paste between the chip and the board and in the apertures to provide thermal connection between the chip and the heat sink.

19. In the process of claim 18, wherein the apertures extend through the heat sink, the improvement further including applying a seal over the heat sink to close the apertures.

* * * * *